(12) United States Patent
Xu et al.

(10) Patent No.: US 12,080,212 B2
(45) Date of Patent: Sep. 3, 2024

(54) ARRAY SUBSTRATE AND DISPLAY PANEL

(71) Applicant: Hefei Visionox Technology Co., Ltd., Anhui (CN)

(72) Inventors: Chuanzhi Xu, Hefei (CN); Zhengfang Xie, Hefei (CN); Zhen Xia, Anhui (CN)

(73) Assignee: HEFEI VISIONOX TECHNOLOGY CO., LTD., Hefei (CN)

( * ) Notice: Subject to any disclaimer, the term of this patent is extended or adjusted under 35 U.S.C. 154(b) by 0 days.

(21) Appl. No.: 18/358,197

(22) Filed: Jul. 25, 2023

(65) Prior Publication Data

US 2023/0368715 A1 Nov. 16, 2023

Related U.S. Application Data

(63) Continuation of application No. PCT/CN2022/096038, filed on May 30, 2022.

(30) Foreign Application Priority Data

Oct. 21, 2021 (CN) .......................... 202111229137.0

(51) Int. Cl.
*G09G 3/3266* (2016.01)
*G09G 3/20* (2006.01)
(Continued)

(52) U.S. Cl.
CPC .............. *G09G 3/20* (2013.01); *H01L 27/124* (2013.01); *H03K 17/6871* (2013.01); *H03K 17/693* (2013.01)

(58) Field of Classification Search
CPC ...... G09G 3/20; G09G 3/3291; G09G 3/3266; H01L 27/124; H03K 17/6871; H03K 17/693
See application file for complete search history.

(56) References Cited

U.S. PATENT DOCUMENTS

2022/0320228 A1* 10/2022 Du ..................... G09G 3/3291
2022/0392408 A1* 12/2022 Zhang ................. G09G 3/3266

FOREIGN PATENT DOCUMENTS

| CN | 1820295 A | 8/2006 |
|---|---|---|
| CN | 111162199 A | 5/2020 |

(Continued)

OTHER PUBLICATIONS

International Search Report issued on Sep. 7, 2022, in corresponding International Application No. PCT / CN2022/096038, 4 pages.

*Primary Examiner* — Abdul-Samad A Adediran
(74) *Attorney, Agent, or Firm* — Maier & Maier, PLLC

(57) ABSTRACT

An array substrate, a display panel, and a display apparatus. The array substrate includes: pixel anodes located in the first display area and corresponding to a plurality of pixel light emitting units arranged in the first display area; driving circuits located in the second display area and configured to drive the pixel light emitting units to emit light; multiplex distribution units located in the first display area and arranged corresponding to a part of the pixel anodes, a projection of the multiplex distribution unit on the array substrate overlapping a projection of a corresponding one of the pixel anodes on the array substrate; first leads, the multiplex distribution unit being connected with the driving circuits through the first lead; and second leads, one multiplex distribution unit being electrically connected with N groups of the pixel anodes through N second leads.

18 Claims, 6 Drawing Sheets

(51) Int. Cl.
*H01L 27/12* (2006.01)
*H03K 17/687* (2006.01)
*H03K 17/693* (2006.01)

(56) References Cited

FOREIGN PATENT DOCUMENTS

| | | | |
|---|---|---|---|
| CN | 111785761 A | 10/2020 | |
| CN | 111863909 A | 10/2020 | |
| CN | 112117320 A | 12/2020 | |
| CN | 113053981 A | 6/2021 | |
| CN | 13920879 A | 1/2022 | |
| JP | 2007299012 A | 11/2007 | |
| WO | 2019242510 A1 | 12/2019 | |

\* cited by examiner

ARRAY SUBSTRATE AND DISPLAY PANEL

CROSS REFERENCE TO RELATED APPLICATION

The present application is a continuation of International Application No. PCT/CN2022/096038 filed on May 30, 2022, which claims priority to Chinese Patent Application No. 202111229137.0 filed on Oct. 21, 2021, both of which are incorporated herein by reference in their entireties.

FIELD

The present application relates to the field of display technology, and particularly, to an array substrate and a display panel.

BACKGROUND

With the development of display technology, users' demands for the screen-to-body ratio of the display panel are higher and higher. The technologies such as "notch screen", "pop-up camera" and "holed screen" are all aimed at increasing the screen-to-body ratio of the display panel. Currently, a light-transmitting display area may be arranged on the display panel, and photosensitive components such as cameras and infrared light sensors are arranged at the back of the light-transmitting display area, so as to achieve a full-screen display for the display panel while ensuring the normal operation of the photosensitive components.

In order to ensure the light-transmitting performance of the light-transmitting display area, driving circuits for pixel light emitting units in the light-transmitting display area are arranged outside the light-transmitting display area, and pixel anodes of the pixel light emitting units in the light-transmitting display area need to be respectively connected with the corresponding driving circuits through anode leads. The anode leads occupy space of the light-transmitting display area, therefore the number of the pixel light emitting units in the light-transmitting display area is limited and the display effect of the display panel is affected.

SUMMARY

Embodiments of the present application provide an array substrate and a display panel, which can increase the number of the pixel light emitting units in a first di splay area, i.e., the light-transmitting display area, so as to improve the display effect of the display panel.

In a first aspect, the embodiments of the present application provide an array substrate, including a first display area and a second display area, a light transmittance of the first display area being greater than a light transmittance of the second display area, the array substrate including: a plurality of pixel anodes located in the first display area and corresponding to a plurality of pixel light emitting units arranged in the first display area; a plurality of driving circuits located in the second display area and configured to drive the pixel light emitting units in the first display area to emit light; a plurality of multiplex distribution units located in the first display area and arranged corresponding to a part of the pixel anodes, a projection of the multiplex distribution unit on the array substrate overlapping a projection of a corresponding one of the pixel anodes on the array substrate; a plurality of first leads, the multiplex distribution unit being connected with the driving circuits through the first lead; and a plurality of second leads, one multiplex distribution unit being electrically connected with N groups of the pixel anodes through N second leads, and N being an integer greater than 1.

In a second aspect, the embodiments of the present application provide a display panel including the array substrate of the first aspect.

In a third aspect, the embodiments of the present application provide an array substrate, including a first display area and a second display area, a light transmittance of the first display area being greater than a light transmittance of the second display area, the array substrate including: a plurality of pixel anodes located in the first display area and corresponding to a plurality of pixel light emitting units arranged in the first display area; a plurality of driving circuits located in the second display area and configured to drive the pixel light emitting units in the first display area to emit light; a plurality of multiplex distribution units located in the first display area and arranged corresponding to a part of the pixel anodes, a projection of the multiplex distribution unit on the array substrate overlapping a projection of a corresponding one of the pixel anodes on the array substrate; a plurality of first leads, the multiplex distribution unit being connected with the driving circuits through the first lead; and a plurality of second leads, one multiplex distribution unit being electrically connected with N groups of the pixel anodes through N second leads, and N being equal to 1.

The embodiments of the present application provide an array substrate and a display panel, the pixel anodes in the array substrate are arranged in the first display area, and the driving circuits are arranged in the second display area. The multiplex distribution units are arranged corresponding to a part of the pixel anodes, and the projection of the multiplex distribution unit on the array substrate overlaps the projection of the corresponding pixel anode on the array substrate. The second lead for connecting the multiplex distribution unit and the pixel anode with overlapping projections on the array substrate does not exceed the pixel anode. Under a condition that one multiplex distribution unit is electrically connected with N groups of the pixel anodes through N second leads, one of the N second leads does not exceed the pixel anode, and the others of the N second leads exceed the pixel anodes. More pixel anodes can be driven using fewer leads that exceed the pixel anodes, that is, more pixel light emitting units can be driven using fewer leads that exceed the pixel anodes, so that under a condition that the number of the leads that exceed the pixel anodes is fixed, the number of the pixel anodes in the first display area, i.e., the light-transmitting display area, is increased, and the number of the pixel light emitting units in the first display area is increased. The limitation on the number of the pixel light emitting units in the light-transmitting display area is reduced, and the display performance of the display panel including the array substrate is improved.

DETAILED DESCRIPTION

With the development of display technology, users' demands for the screen-to-body ratio of the display panel are higher and higher. In a display apparatus such as a cell phone and a tablet computer, photosensitive components such as a front camera, an infrared light sensor, and a proximity light sensors need to be integrated at a side of the display panel. A light-transmitting display area may be arranged on the display panel, and the above photosensitive components are arranged at the back of the light-transmitting display area, so as to achieve a full-screen display for the display panel while ensuring the normal operation of the photosensitive components.

In order to ensure the normal operation of the photosensitive components, it is necessary to ensure the light-transmitting performance of the light-transmitting display area, the driving circuits for the pixel light emitting units in the light-transmitting display area may be arranged outside the light-transmitting display area. The pixel anode of each of the pixel light emitting units in the light-transmitting display area is connected to the driving circuit corresponding to the pixel light emitting unit through an anode lead, so that the driving circuit can drive the pixel light emitting unit in the light-transmitting display area to emit light. However, since the anode lead needs to occupy a certain space in the light-transmitting display area, the number of the anode leads is limited, and correspondingly, on the one hand, the number of the pixel light emitting units in the light-transmitting display area is also limited, and the width of the light-transmitting display area is thus limited, the display effect of the display panel is affected; on the other hand, the pixel density (Pixels Per Inch, PPI) of the pixel light emitting units in the light-transmitting display area and the pixel density of the pixel light emitting units in a display area outside the light-transmitting display area are also limited, and the display effect of the display panel is affected.

The present application provides an array substrate and a display panel, which can utilize fewer anode leads to control more pixel light emitting units, so as to reduce the limitation on the number of the pixel light emitting units in the light-transmitting display area, increase the number of the pixel light emitting units in the light-transmitting display area, and increase the width of the light-transmitting display area, the display effect of the display panel is improved.

Figure 1:
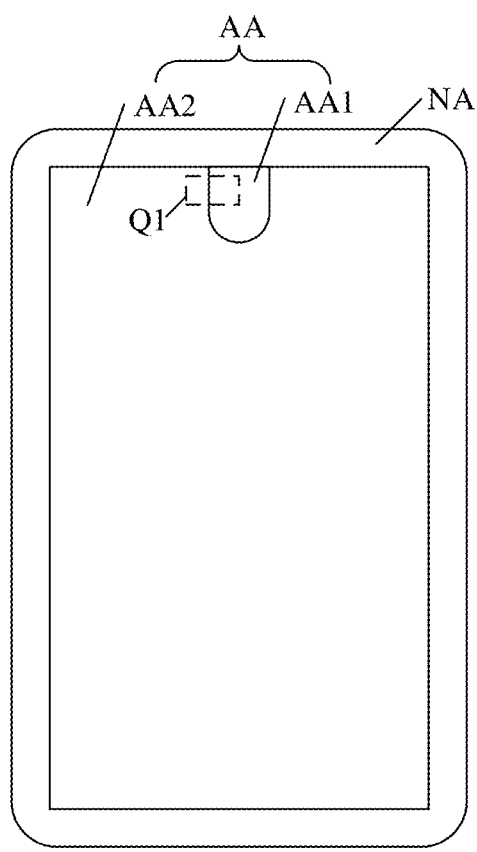
FIG. 1 shows a schematic top view of an embodiment of an array substrate according to the present application.

As shown in FIG. 1, the array substrate includes a display area AA and a non-display area NA. The display area AA includes a first display area AA1 and a second display area AA2.

The second display area AA2 surrounds at least a part of the first display area AA1. The light transmittance of the first display area AA1 is greater than the light transmittance of the second display area AA2, and the first display area AA1 is the light-transmitting display area. For example, the light transmittance of the first display area AA1 may be greater than or equal to 15%, or even greater than 40%, or even a greater light transmittance. The light transmittance of the first display area AA1 is greater than the light transmittance of the second display area AA2, so that the photosensitive components can be integrated at the back of the first display area AA1 of the display panel, while the first display area AA1 can still display the image, the screen-to-body ratio of the display panel is improved and the full-screen design is achieved for the display panel.

Figure 2:
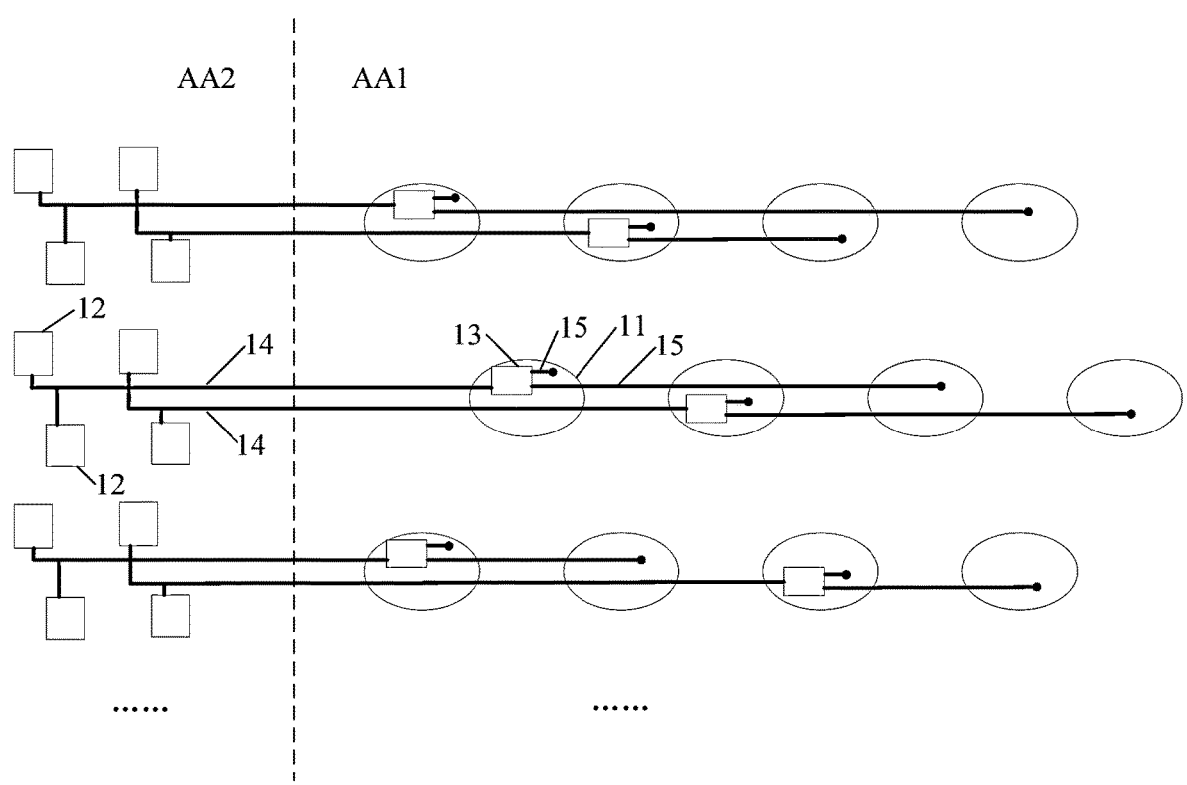
FIG. 2 shows a partially enlarged diagram of an example of area Q1 in FIG. 1.
Figure 3:
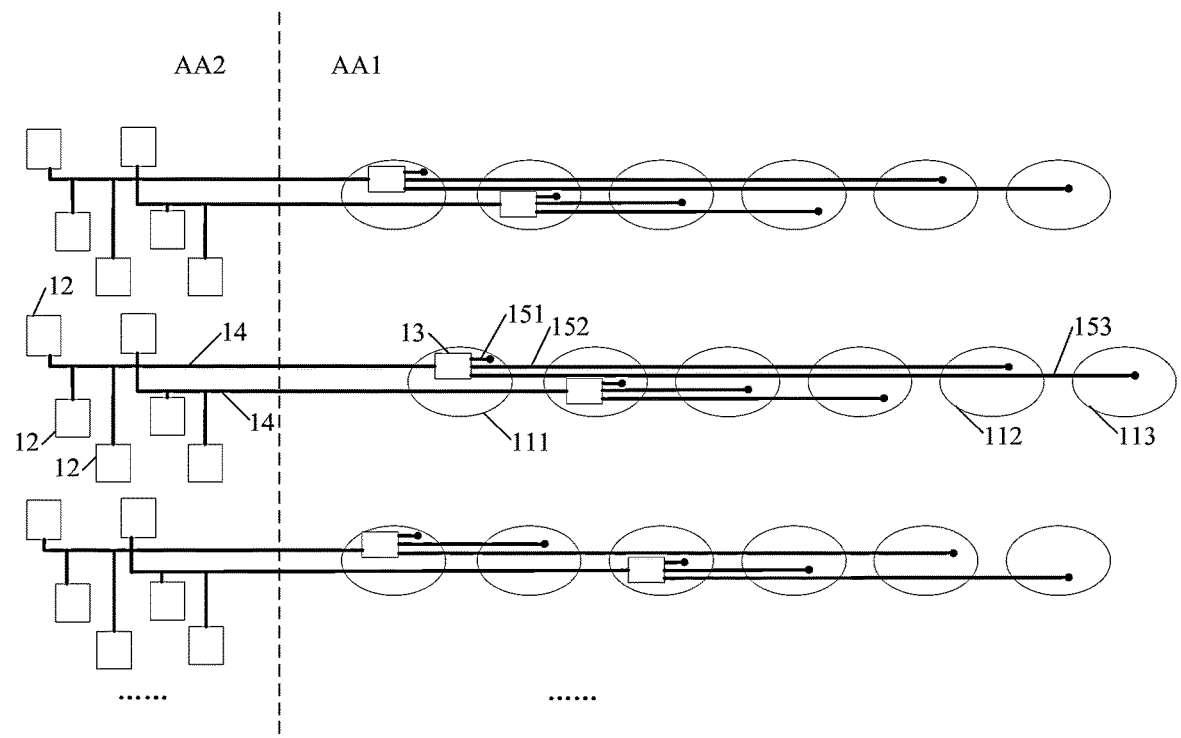
FIG. 3 shows a partially enlarged diagram of another example of area Q1 in FIG. 1.
Figure 4:
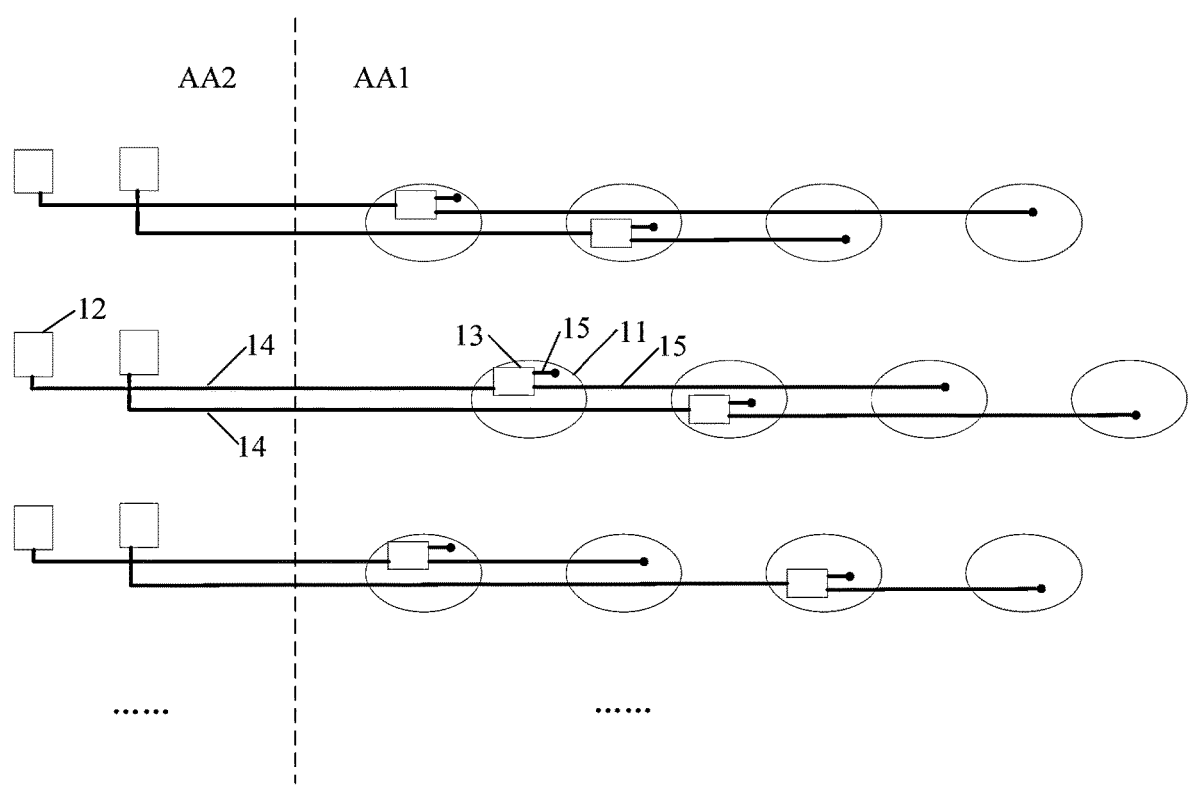
FIG. 4 shows a partially enlarged diagram of yet another example of area Q1 in FIG. 1.

As shown in FIGS. 2, 3 and 4, the array substrate may include a pixel anode 11, a driving circuit 12, a multiplex distribution unit 13, a first lead 14 and a second lead 15.

The pixel anode 11 is located in the first display area AA1. A plurality of pixel anodes 11 are arranged in the first display area AA1. The pixel anodes 11 are corresponding to the pixel light emitting units in the first display area AA1. The pixel anode 11 is the anode of the pixel light emitting unit in the first display area AA1.

The driving circuit 12 is located in the second display area AA2 and configured to drive the pixel light emitting unit in the first display area to emit light. A plurality of driving circuits 12 are arranged in the second display area AA2. In some examples, each of the pixel light emitting units in the first display area AA1 is corresponding to one driving circuit 12 in the second display area AA2. The driving circuit 12 can provide driving signals to the pixel anode 11 in the first display area AA1.

The multiplex distribution unit 13, i.e., the demux unit, is located in the first display area AA1 and may be arranged corresponding to a part of the pixel anodes 11. A plurality of multiplex distribution units 13 are arranged in the first display area AA1. The multiplex distribution unit 13 can switch a common input line to one of a plurality of individual output lines. One multiplex distribution unit 13 may be electrically connected with N groups of the pixel anodes 11, N is the number of the individual output lines that the multiplex distribution unit can switch, and N is an integer greater than 1. The projection of the multiplex distribution unit 13 on the array substrate overlaps the projection of the corresponding pixel anode 11 on the array substrate, that is, the projection of the multiplex distribution unit 13 on the array substrate falls within the projection of the corresponding pixel anode 11 on the array substrate. The multiplex distribution unit 13 and the pixel anode 11 with overlapping projections on the array substrate are electrically connected. For the N groups of the pixel anodes 11 electrically connected with one multiplex distribution unit 13, the projection of one of the pixel anodes 11 on the array substrate includes the projection of this multiplex distribution unit 13 on the array substrate, that is, the projection of one multiplex distribution unit 13 on the array substrate falls within the projection of one pixel anode 11 in the N groups of the pixel anodes 11 electrically connected with this multiplex distribution unit 13 on the array substrate, and not the projection of each pixel anode 11 in the N groups of the pixel anodes 11 on the array substrate includes the projection of this multiplex distribution unit 13 on the array substrate. In some examples, the multiplex distribution unit 13 is located between the pixel anode 11 and the base plate of the array substrate.

The first lead 14 is electrically connected with the second lead 15 through the multiplex distribution unit 13. The first lead 14 is configured to connect the driving circuit 12 with the multiplex distribution unit 13. Specifically, the multiplex distribution unit 13 may be electrically connected with the driving circuit 12 through the first lead 14, so as to achieve the electrical connection between the driving circuit 12 and the multiplex distribution unit 13. The second lead 15 is configured to connect the multiplex distribution unit 13 with the pixel anode 11. Specifically, one multiplex distribution unit 13 may be electrically connected with N groups of the pixel anodes 11 through N second leads 15, so as to achieve the electrical connection between the multiplex distribution unit 13 and the pixel anode 11. Correspondingly, the driving circuit 12 is electrically connected with the pixel anode 11 through the first lead 14, the multiplex distribution unit 13, and the second lead 15. Herein, N is an integer greater than 1. In some examples, the pixel light emitting units corresponding to the N groups of the pixel anodes 11 electrically connected with a same multiplex distribution unit 13 may emit lights of a same color or different colors, which is not limited herein.

One group of the pixel anodes 11 includes one pixel anode 11 or two or more pixel anodes 11. Specifically, one multiplex distribution unit 13 is directly electrically connected with one pixel anode 11 in one group of the pixel anodes 11 through one of N second leads 15, i.e., one multiplex distribution unit 13 is connected with one pixel anode 11 through one second lead 15.

In some examples, one group of the pixel anodes 11 includes one pixel anode 11. As shown in FIG. 2, one multiplex distribution unit 13 may be connected with two pixel anodes 11 through two second leads 15, i.e., N=2. Herein, one of the second leads 15 is connected with one of the pixel anodes 11, and the projection of this second lead 15 on the array substrate overlaps the projection of this pixel anode 11 on the array substrate; the other of the second leads 15 is connected with the other of pixel anodes 11, and at least a part of the projection of this second lead 15 on the array substrate does not overlap the projection of this pixel anode 11 on the array substrate.

As shown in FIG. 3, one group of the pixel anodes 11 includes one pixel anode 11. The second leads in FIG. 3 includes second leads 151, 152, and 153, and the pixel anodes may include pixel anodes 111, 112, and 113. One multiplex distribution unit 13 may be connected with three pixel anodes 111, 112 and 113 through three second leads 151, 152, and 153, i.e., N=3. Herein, the second lead 151 is connected with the pixel anode 111, and the projection of the second lead 151 on the array substrate overlaps the projection of the pixel anode 111 on the array substrate; the second lead 152 is connected with the pixel anode 112, and at least a part of the projection of the second lead 152 on the array substrate does not overlap the projection of the pixel anode 112 on the array substrate; the second lead 153 is connected with the third pixel anode 113, and at least a part of the projection of the second lead 153 on the array substrate does not overlap the projection of the pixel anode 113 on the array substrate.

In some other examples, one group of the pixel anodes 11 includes two or more pixel anodes 11. Under a condition that one group of the pixel anodes 11 includes two or more pixel anodes 11, the pixel anodes 11 in this group of pixel anodes 11 are electrically connected in sequence. For example, the pixel anodes 11 in this group of pixel anodes 11 may be connected in series. Specifically, under a condition that one group of the pixel anodes 11 includes two or more pixel anodes 11, the pixel light emitting units corresponding to the pixel anodes 11 in this group of pixel anodes 11 emit lights of a same color.

In some examples, as shown in FIG. 4, one multiplex distribution unit 13 may be electrically connected with one driving circuit 12 through one first lead 14. This driving circuit 12 may provide driving signals to N groups of the pixel anodes 11 connected with a same multiplex distribution unit 13 in a time-division manner, i.e., one driving circuit 12 may be utilized to provide drive signals to the N groups of the pixel anodes 11.

In some examples, N=1, that is, one multiplex distribution unit 13 may be electrically connected with one group of the pixel anodes 11 through one second lead 15, and the driving circuit 12 connected with this multiplex distribution unit 13 can drive the pixel anodes 11 connected with this second lead 15. The first display area may be controlled to display or not to display through the multiplex distribution unit 13, and the plurality of multiplex distribution units 13 in the first display area may be selectively turned on, for example, the plurality of multiplex distribution units 13 in the first display area AA1 are determined whether to be turned on according to the application of the display panel including the array substrate. For example, in some cases in which the photosensitive components are used, the plurality of multiplex distribution units 13 in the first display area AA1 are controlled to be disconnected, i.e., the first display area AA1 is in a non-display state. The display life of the first display area AA1 can be improved by controlling, through the multiplex distribution unit 13, the first display area not to emit light when not necessary.

Under a condition that N>1, the solution of the example can correspondingly reduce the number of the driving circuits 12 in the second display area AA2 for driving the pixel anodes 11 in the first display area AA1. For example, under a condition that N=2, the number of the driving circuits 12 in the second display area AA2 for driving the pixel anodes 11 in the first display area AA1 can be reduced by half. The reduction in the number of the driving circuits 12 in the second display area AA2 for driving the pixel anodes 11 in the first display area AA1 can reduce the space in the second display area AA2 for arranging the driving circuits 12 for driving the pixel anodes 11 in the first display area AA1, the variety and scalability for arranging the pixel light emitting units in the second display area AA2 are improved.

For the multiplex distribution unit 13 and the pixel anode 11 with overlapping projections on the array substrate, the second lead 15 connecting them does not exceed this pixel anode 11. For the multiplex distribution unit 13 and the pixel anode 11 with overlapping projections on the array substrate, the projection of this pixel anode 11 on the array substrate includes the projection of the second lead 15 connecting them on the array substrate, i.e., the projection of the second lead 15 connecting them on the array substrate overlaps the projection of this pixel anode 11 on the array substrate, and the second lead 15 connecting them does not limit the number of the pixel light emitting units in the first display area AA1, i.e., the light-transmitting display area.

The leads that exceed the pixel anodes in the light-transmitting display area will affect the number of the pixel light emitting units in the light-transmitting display area. The lead that exceeds the pixel anode refers to a lead for which at least a part of the projection on the array substrate does not overlap the projection of this pixel anode on the array substrate. The multiplex distribution unit 13 is arranged in the array substrate of the embodiments of the present application, and since the projection of the multiplex distribution unit 13 on the array substrate overlaps the projection of the corresponding pixel anode 11 on the array substrate, the second lead 15 for connecting this multiplex distribution unit 13 and this pixel anode 11 does not exceed the pixel anode 11. The electrical connections between the multiplex distribution unit 13 and the N groups of the pixel anodes 11 require one second lead 15 that does not exceed the pixel anode 11 and N−1 second leads 15 that exceed the pixel anode 11, thereby reducing the number of the leads that exceed the pixel anodes 11 while being able to drive the same number of pixel anodes. That is, more pixel anodes can be driven with a certain number of the leads that exceed the pixel anodes 11, the limitation on the number of the pixel light emitting units in the light-transmitting display area is reduced.

Figure 5:
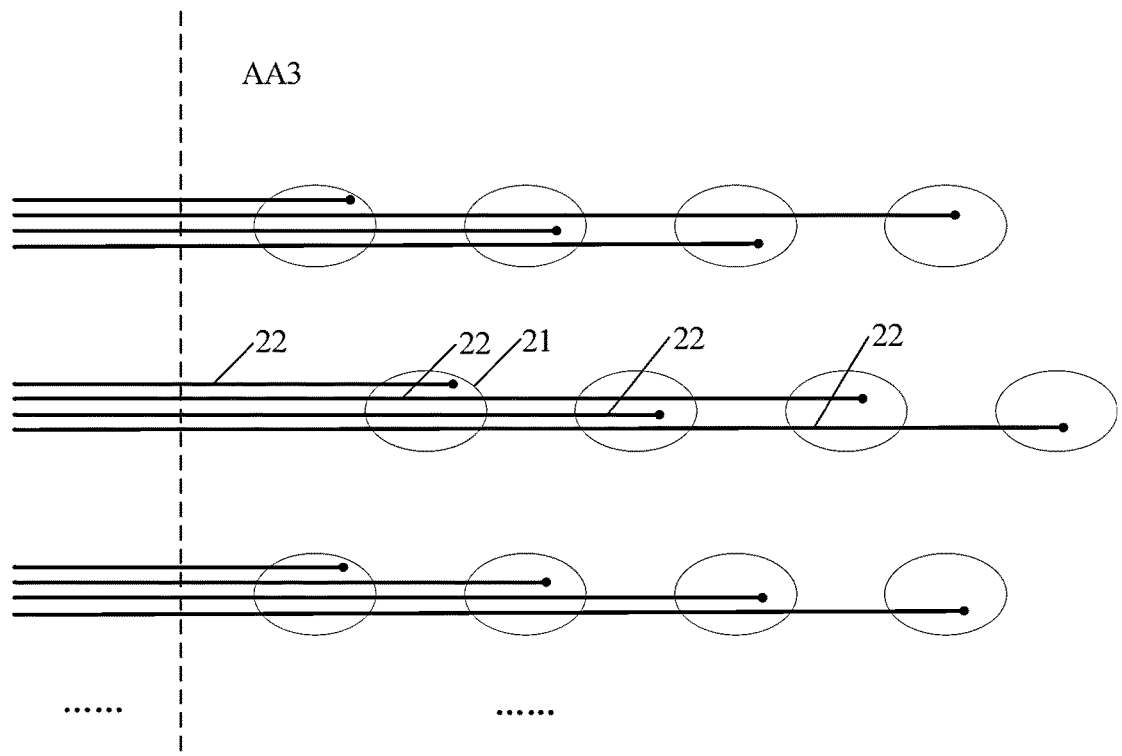
FIG. 5 shows a schematic structural diagram of a light-transmitting display area of an array substrate.

As shown in FIG. 5, a plurality of pixel anodes 21 are arranged in a light-transmitting display area AA3, and each of the pixel anodes 21 is connected with a driving circuit outside the light-transmitting display area AA3 through one anode lead 22. The anode lead 22 is a lead that exceeds the pixel anode 21. The number of the anode leads 22 is equal to the number of the pixel anodes 21. One anode lead 22 can drive one pixel anode 21.

For example, thirty anode leads 22 are arranged in the light-transmitting display area AA3, and correspondingly, thirty pixel anodes 21 are arranged in the light-transmitting display area AA3, the number of the pixel anodes 21 in the light-transmitting display area AA3 is limited by the great number of anode leads 22, and therefore the number of the pixel light emitting units in the light-transmitting display area AA3 is limited by the great number of anode leads 22.

In the embodiments of the present application, the leads that exceed the pixel anodes 11 in the first display area AA1 will affect the number of the pixel light emitting units in the first display area AA1. As shown in FIG. 2, the second lead 15 for connecting the multiplex distribution unit 13 and the pixel anode 11 for which the projections on the array substrate do not overlap exceeds this pixel anode 11. That is, at least a part of the projection of the second lead 15 for connecting the multiplex distribution unit 13 and the pixel anode 11, for which the projections on the array substrate do not overlap, on the array substrate does not overlap the projection of this pixel anode 11 on the array substrate. The array substrate as shown in FIGS. 1 and 2 can drive two pixel anodes 11, through the multiplex distribution unit 13, using one second lead 15 that does not exceed the pixel anode 11 and one second lead 15 that exceeds the pixel anode 11. The second lead 15 that exceeds the pixel anode 11 may be regarded as an anode lead, that is, two pixel anodes 11 can be driven by one anode lead, and under a condition that the number of the anode leads is fixed, the number of the pixel anodes 11 in the first display area AA1 can be increased, i.e., the number of the pixel light emitting units in the first display area AA1 can be increased.

For example, one group of the pixel anodes 11 includes one pixel anode 11, and one multiplex distribution unit 13 is electrically connected with two pixel anodes 11 through two second leads 15. Every two second leads 15 include one second lead 15 that does not exceed the pixel anode 11 and one second lead 15 that exceeds the pixel anode 11. Thirty second leads 15 that exceed the pixel anodes 11 are arranged in the first display area AA1 and can drive sixty pixel anodes 11. Compared with the arrangement of the light-transmitting display area as shown in FIG. 5, the number of the pixel anodes 11 in the first display area AA1 in the embodiments of the present application is doubled, and correspondingly, the number of the pixel light emitting units in the first display area AA1 in the embodiments of the present application is also doubled.

In the embodiments of the present application, the pixel anodes 11 are arranged in the first display area AA1, and the driving circuits 12 are arranged in the second display area AA2. The multiplex distribution units 13 are arranged corresponding to a part of the pixel anodes 11, and the projection of the multiplex distribution unit 13 on the array substrate overlaps the projection of the corresponding pixel anode 11 on the array substrate. The second lead 15 for connecting the multiplex distribution unit 13 and the pixel anode 11 with overlapping projections on the array substrate does not exceed the pixel anode. Under a condition that one multiplex distribution unit 13 is electrically connected with N groups of the pixel anodes 11 through N second leads 15, one of the N second leads 15 does not exceed the pixel anode, and N−1 of the N second leads 15 exceed the pixel anodes 11. More pixel anodes 11 can be driven using fewer leads that exceed the pixel anodes 11, that is, more pixel light emitting units can be driven using fewer leads that exceed the pixel anodes 11, so that under a condition that the number of the leads that exceed the pixel anodes 11 is fixed, the number of the pixel anodes 11 in the first display area AA1 can be increased, and the number of the pixel light emitting units in the first display area AA1, i.e., the light-transmitting display area, is increased. The limitation on the number of the pixel light emitting units in the first display area AA1, i.e., the light-transmitting display area, is reduced, and the display performance of the display panel including the array substrate is improved.

Moreover, under a condition that the number of the leads that exceed the pixel anodes 11 is fixed, the increasing of the number of the pixel light emitting units in the first display area AA1, i.e., the light-transmitting display area, further increases the pixel density of the pixel light emitting units in the first display area AA1.

Figure 6:
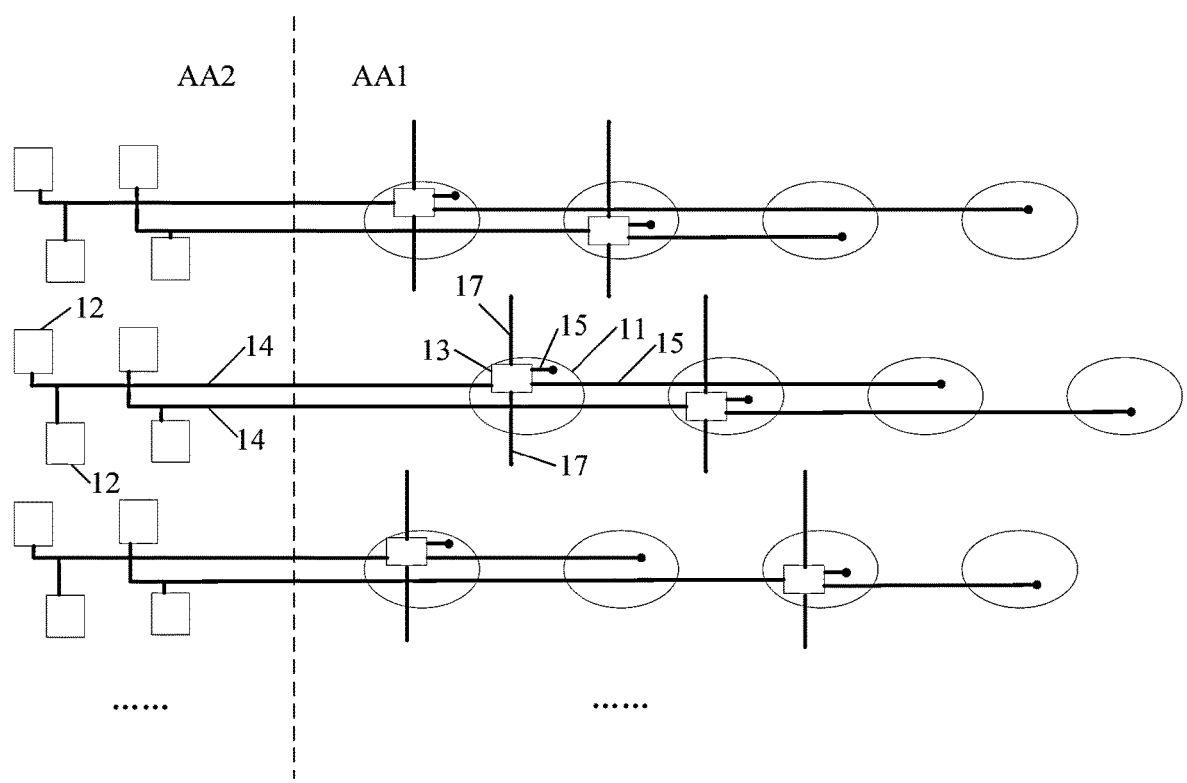
FIG. 6 shows a partially enlarged diagram of yet another example of area Q1 in FIG. 1.

In the above embodiments, the multiplex distribution unit 13 may be electrically connected with N control signal lines. The multiplex distribution unit 13 may be configured to control N driving branches to be individually turned on by means of N control signals provided by the control signal lines. One of the N driving branches is turned on at a same moment. Each driving branch includes one first lead 14, one second lead 15, and one group of the pixel anodes 11. For example, if N=2, the first driving branch is turned on when the second driving branch is off, and the first driving branch is turned off when the second driving branch is turned on. For example, as shown in FIG. 6, N=2, the multiplex distribution unit 13 is electrically connected with two control signal lines 17.

In some examples, the multiplex distribution units 13 arranged corresponding to the pixel anodes 11 in a same row may share N control signal lines, which is not limited herein. The wiring in the first display area AA1 can be further reduced by sharing the N control signal lines.

Figure 7:
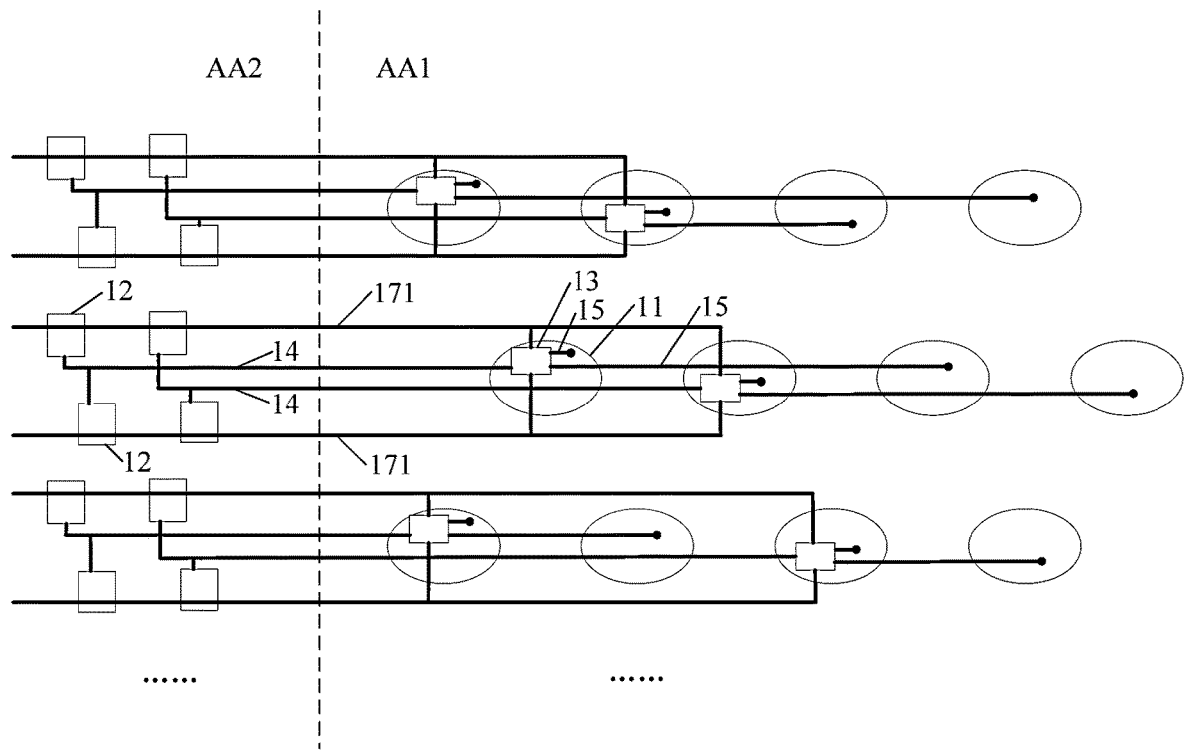
FIG. 7 shows a partially enlarged diagram of yet another example of area Q1 in FIG. 1.

In some examples, the control signal lines may include a clock signal line or a light emitting control signal line connected with the driving circuit. The clock signal line may provide a clock signal, and effective levels of clock signals provided by two clock signal lines connected with a same multiplex distribution unit 13 are staggered in time. Two light emitting control signal lines, i.e., EM lines, connected with a same multiplex distribution unit 13 may be the light emitting control signal lines 171 respectively connected with the two rows of the driving circuits in the second display area AA2, that is, the control signal lines connected with one multiplex distribution unit 13 include the light emitting control signal lines respectively connected with the corresponding two rows of the driving circuits. For example, as shown in FIG. 7, N=2, and one multiplex distribution unit 13 is electrically connected with two light emitting control signal lines 171. These two light emitting control signal lines 171 are respectively connected with two rows of the driving circuits in the second display area AA2. The multiplex distribution units 13 arranged corresponding to a same row of the pixel anodes 11 may share the light emitting control signal lines 171 respectively connected with two row of the driving circuits in the second display area AA2.

Figure 8:
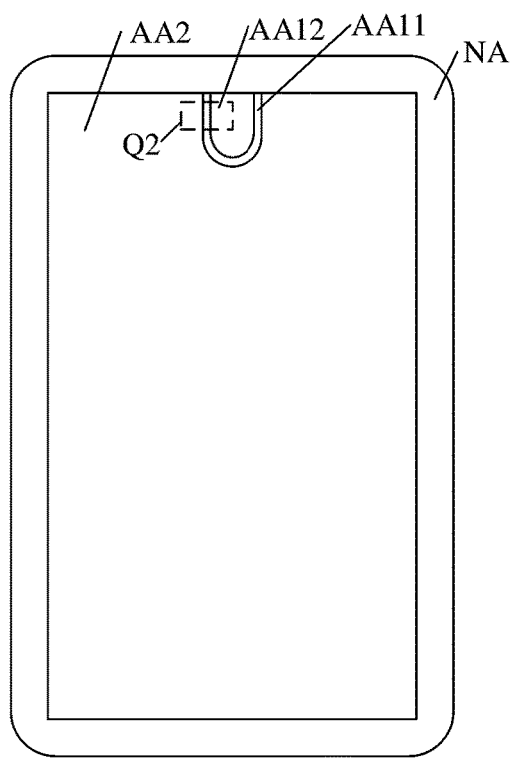
FIG. 8 shows a schematic top view of another embodiment of an array substrate according to the present application.

As shown in FIG. 8, the first display area AA1 may include a first area AA11 and a second area AA12. The first area AA11 is located between the second display area AA2 and the second area AA12. The first area AA11 may surround at least a part of the second area AA12. The first area AA11 is closer to the second display area AA2 than the second area AA12.

Figure 9:
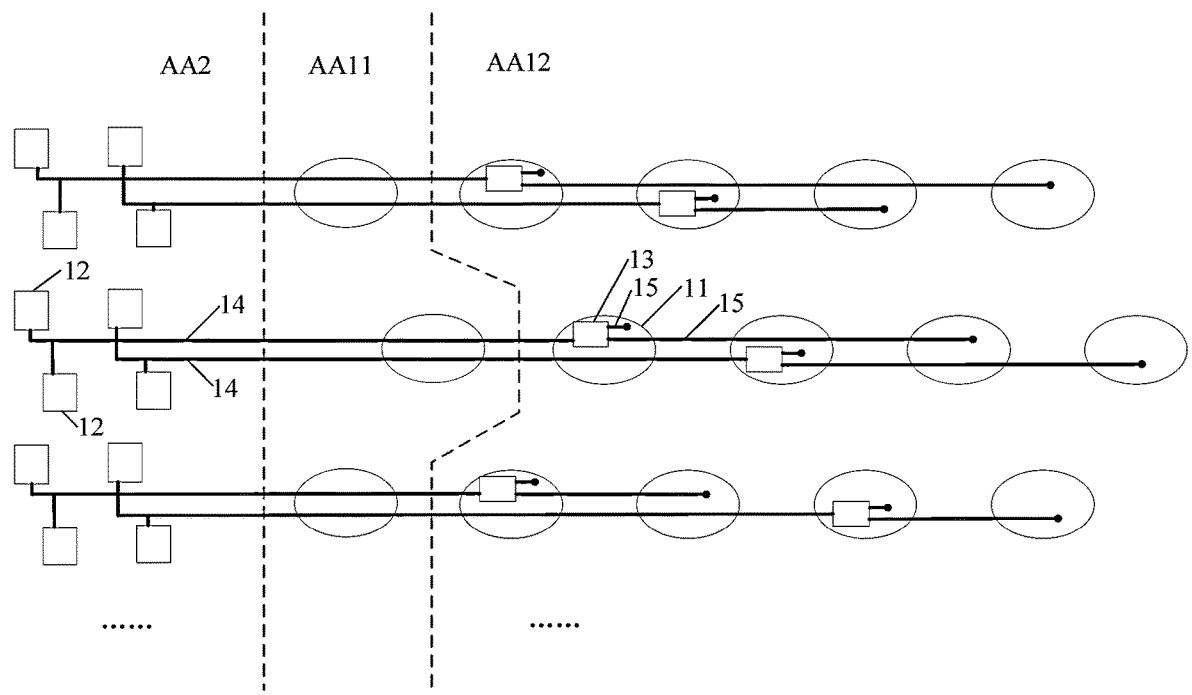
FIG. 9 shows a partially enlarged diagram of an example of area Q2 in FIG. 8.

The multiplex distribution units 13 in the above embodiments may be located in the second area AA12. i.e., the multiplex distribution units 13 are arranged corresponding to at least a part of the pixel anodes 11 in the second area AA12. As shown in FIG. 9, no multiplex distribution unit 13 is arranged in the first area AA11, and the multiplex distribution units 13 are located in the second area AA12. The pixel anodes 11 in the first area AA11 may be electrically connected with the driving circuits 12 in the second display area AA2, and specifically, the pixel anodes 11 in the first area AA11 may be electrically connected with the driving circuits 12 in the second display area AA2 through leads, the driving circuits 12 connected with the pixel anodes 11 in the first area AA11 are not shown in FIG. 9. Since the boundary of the second area AA12 is very close to the second display area AA2, i.e., the first area AA11 occupies a small area of the first display area AA1, few pixel anodes 11 are located in the first area AA11. Although the pixel anodes 11 in the first area AA11 are connected with the driving circuits 12 through leads, the leads are few, therefore the connection between the pixel anodes 11 in the first area AA11 and the driving circuits will not limit, or just slightly limit, the number of the pixel anodes 11 in the first display area AA1, and will not adversely affect the number of the pixel light emitting units in the first display area.

Figure 10:
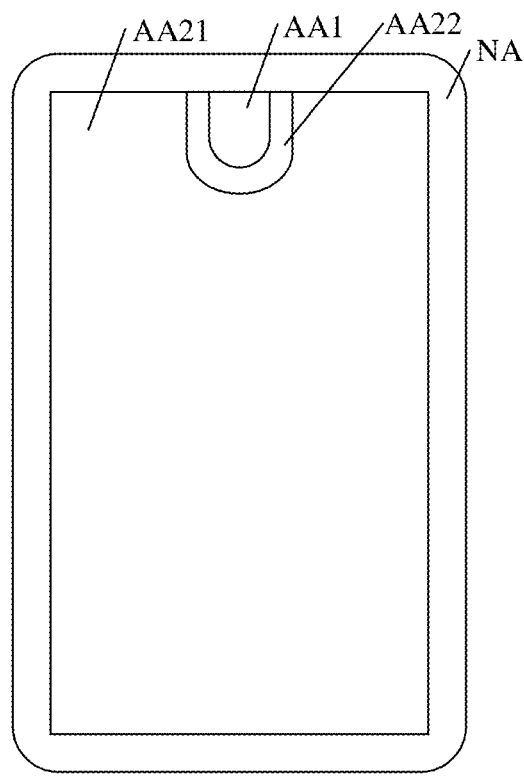
FIG. 10 shows a schematic top view of yet another embodiment of an array substrate according to the present application.

As shown in FIG. 10, the second display area AA2 may include a third area AA21 and a fourth area AA22. The fourth area AA22 is located between the third area AA21 and the first display area AA1. The third area AA21 may be regarded as a main screen area, and the fourth area AA22 may be regarded as a transition area. The fourth area AA22 may surround at least a part of the first display area AA1. The driving circuits 12 may be specifically located in the fourth area AA22.

In some examples, under a condition that N>1, one driving circuit 12 may drive N groups of the pixel anodes 11 through one first lead 14, therefore the number of the driving circuits 12 in the fourth area AA22 for driving the pixel anodes 11 in the first display area AA1 can be reduced, and thus the size of the fourth area AA22 can be reduced.

In some examples, the light transmittance of the fourth area AA22 may be smaller than the light transmittance of the first display area AA1, and the light transmittance of the fourth area AA22 may be greater than or equal to the light transmittance of the third area AA21, which is not limited herein.

In the above embodiments, one multiplex distribution unit 13 may include N thin film transistors. A control terminal of the thin film transistor may be electrically connected with the control signal line, a first terminal of the thin film transistor may be electrically connected with first lead 14, and a second terminal of the thin film transistor may be electrically connected with the second lead 15. The thin film transistors may be switched on or off under the control of the control signals provided by the control signal lines 17, so as to turn on or off the driving branches. Specifically, the control terminal of the thin film transistor may be the gate, the first terminal may be the source, and the second terminal may be the drain; or the control terminal of the thin film transistor may be the gate, the first terminal may be the drain, and the second terminal may be the source, which is not limited herein.

Figure 11:
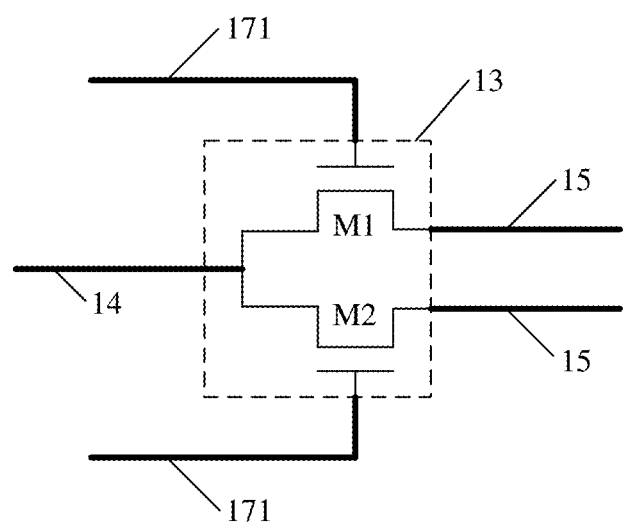
FIG. 11 shows a schematic structural diagram of an example of a multiplex distribution unit in FIG. 7.

As shown in FIGS. 7 and 11, N=2, the multiplex distribution unit 13 includes two thin film transistors labelled as M1 and M2, respectively. The control terminal of the thin film transistor M1 is connected with the light emitting control signal line 171 connected to one row of the driving circuits 12, the first terminal of the thin film transistor M1 is connected with the first lead 14, and the second terminal of the thin film transistor M1 is connected with one second lead 15. The control terminal of the thin film transistor M2 is connected with the light emitting control signal line 171 connected to another row of the driving circuits 12, the first terminal of the thin film transistor M2 is connected with the first lead 14, and the second terminal of the thin film transistor M2 is connected with another second lead 15. The pixel anodes 11 can be driven by controlling the thin film transistors M1 and M2 to be switched on or off. In some examples, the thin film transistors M1 and M2 will not be switched on at the same time.

The first lead 14 and the second lead 15 in the above examples may be transparent material wiring such as indium tin oxide wiring, i.e., ITO wiring, or non-transparent material wiring, which is not limited herein.

The present application further provides a display panel which may include the array substrate of the above embodiments. The details of the array substrate can be found in the relevant description of the above embodiments and the technical effect of the array substrate of the above embodiments can be achieved, which will not be repeated herein.

The present application further provides a display apparatus including the display panel of the above embodiments. The details of the array substrate in the display panel can be found in the relevant description of the above embodiments, and will not be repeated herein. The display apparatus may be specifically an apparatus with display function such as a cell phone, a computer, a tablet computer, a TV, an electronic paper, which is not limited herein.

It should be clear that for the display panel embodiments and the display apparatus embodiments, the relevant parts can be found in the description of the array substrate embodiments. The present application is not limited to the particular structures described above and illustrated in the figures. Those skilled in the art can make various changes, modifications and additions after understanding the gist of the present application. Moreover, for the sake of brevity, the detailed description of the known techniques is omitted herein.

What is claimed is:

1. An array substrate comprising a first display area and a second display area, wherein a light transmittance of the first display area is greater than a light transmittance of the second display area, the array substrate comprising:
   a plurality of pixel anodes located in the first display area and corresponding to a plurality of pixel light emitting units arranged in the first display area;

a plurality of driving circuits located in the second display area and configured to drive the plurality of pixel light emitting units in the first display area to emit light;

at least one multiplex distribution unit located in the first display area and arranged corresponding to a part of the plurality of pixel anodes, wherein a projection of the at least one multiplex distribution unit on the array substrate overlaps a projection of a corresponding one of the plurality of pixel anodes on the array substrate;

at least one first lead, wherein the at least one multiplex distribution unit is connected with one driving circuit of the plurality of driving circuits through the at least one first lead; and a plurality of second leads, wherein the at least one multiplex distribution unit is electrically connected with N groups of the plurality of pixel anodes through N second leads, and N being an integer greater than 1.

2. The array substrate of claim 1, wherein the at least one multiplex distribution unit is electrically connected with N control signal lines and configured to control N driving branches to be individually turned on by means of N control signals provided by the N control signal lines, one of the N driving branches is turned on at a same moment, and one driving branch comprises the at least one first lead, one second lead of the plurality of second leads, and one group of the plurality of pixel anodes.

3. The array substrate of claim 2, wherein multiplex distribution units corresponding to the plurality of pixel anodes in a same row share the N control signal lines.

4. The array substrate of claim 2, wherein the at least one multiplex distribution unit further comprises N thin film transistors, a control terminal of each thin film transistor is electrically connected with a control signal line of the N control signal lines, a first terminal of each thin film transistor is electrically connected with the at least one first lead, and a second terminal of each thin film transistor is electrically connected with a second lead of the plurality of second leads.

5. The array substrate of claim 2, wherein the N control signal lines comprise a clock signal line or a light emitting control signal line connected with a driving circuit of the plurality of driving circuits.

6. The array substrate of claim 5, wherein effective levels of clock signals provided by two clock signal lines connected with a same multiplex distribution unit are staggered in time.

7. The array substrate of claim 5, wherein control signal lines connected with the at least one multiplex distribution unit comprise light emitting control signal lines respectively connected with corresponding two rows of the plurality of driving circuits.

8. The array substrate of claim 1, wherein N=2, and the at least one multiplex distribution unit is connected with two groups of the plurality of pixel anodes through two second leads of the plurality of second leads.

9. The array substrate of claim 8, wherein control signal lines connected with the at least one multiplex distribution unit comprise light emitting control signal lines respectively connected with two rows of the plurality of driving circuits.

10. The array substrate of claim 1, wherein, for the projection of the at least one multiplex distribution unit on the array substrate overlapping the projection of the corresponding one of the plurality of pixel anodes, a projection of a second lead of the plurality of second leads connecting the at least one multiplex distribution unit and a pixel anode of the plurality of pixel anodes on the array substrate overlaps the projection of the pixel anode of the plurality of pixel anodes on the array substrate.

11. The array substrate of claim 1, wherein the first display area comprises a first area and a second area, the first area is located between the second display area and the second area, and the at least one multiplex distribution unit is located in the second area.

12. The array substrate of claim 1, wherein the second display area comprises a third area and a fourth area, the fourth area is located between the third area and the first display area, and the plurality of driving circuits is located in the fourth area.

13. The array substrate of claim 1, wherein the plurality of driving circuits is configured to drive N groups of the plurality of pixel anodes through the at least one first lead.

14. The array substrate of claim 12, wherein the plurality of driving circuits is configured to drive N groups of the plurality of pixel anodes through the at least one first lead.

15. The array substrate of claim 1, wherein one group of the plurality of pixel anodes comprises one pixel anode or two or more pixel anodes electrically connected in sequence.

16. The array substrate of claim 1, wherein pixel light emitting units corresponding to the pixel anodes in one group of the plurality of pixel anodes emit lights of a same color.

17. A display panel comprising the array substrate of claim 1.

18. An array substrate comprising a first display area and a second display area, wherein a light transmittance of the first display area is greater than a light transmittance of the second display area, the array substrate comprising:

a plurality of pixel anodes located in the first display area and corresponding to a plurality of pixel light emitting units arranged in the first display area;

a plurality of driving circuits located in the second display area and configured to drive the plurality of pixel light emitting units in the first display area to emit light;

a plurality of multiplex distribution units located in the first display area and arranged corresponding to a part of the plurality of pixel anodes, wherein a projection of the plurality of multiplex distribution units on the array substrate overlaps a projection of a corresponding one of the plurality of pixel anodes on the array substrate;

a plurality of first leads, wherein the plurality of multiplex distribution units is connected with the plurality of driving circuits through the plurality of first-leads; and a plurality of second leads, wherein one multiplex distribution unit of the plurality of multiplex distribution units is electrically connected with N groups of the plurality of pixel anodes through N second leads of the plurality of second leads, and N is equal to 1.

* * * * *